United States Patent
Wang et al.

(10) Patent No.: US 11,574,839 B2
(45) Date of Patent: Feb. 7, 2023

(54) METHOD FOR TRANSFERRING COMPOUND SEMICONDUCTOR SINGLE CRYSTAL THIN FILM LAYER AND METHOD FOR PREPARING SINGLE CRYSTAL GAAS-OI COMPOSITE WAFER

(71) Applicant: BEIJING UNIVERSITY OF TECHNOLOGY, Beijing (CN)

(72) Inventors: Zhiyong Wang, Beijing (CN); Jingjing Dai, Beijing (CN); Tian Lan, Beijing (CN)

(73) Assignee: BEIJING UNIVERSITY OF TECHNOLOGY, Beijing (CN)

( * ) Notice: Subject to any disclaimer, the term of this patent is extended or adjusted under 35 U.S.C. 154(b) by 0 days.

(21) Appl. No.: 16/945,371

(22) Filed: Jul. 31, 2020

(65) Prior Publication Data
US 2021/0035852 A1    Feb. 4, 2021

(30) Foreign Application Priority Data
Jul. 31, 2019   (CN) .......................... 201910703731.5

(51) Int. Cl.
*H01L 21/76*    (2006.01)
*H01L 21/762*   (2006.01)
(52) U.S. Cl.
CPC .... *H01L 21/7605* (2013.01); *H01L 21/76251* (2013.01)
(58) Field of Classification Search
CPC ......... H01L 21/76248; H01L 21/76251; H01L 21/76256; H01L 21/7605
See application file for complete search history.

(56) References Cited

U.S. PATENT DOCUMENTS

| 2006/0284167 | A1 | 12/2006 | Augustine et al. |
| 2018/0076260 | A1* | 3/2018 | Walke ............... H01L 21/76898 |
| 2018/0197736 | A1* | 7/2018 | Kim .................. H01L 21/02444 |

FOREIGN PATENT DOCUMENTS

| CN | 1385906 A | 12/2002 |
| CN | 103021812 A | 4/2013 |

(Continued)

OTHER PUBLICATIONS

Yu, The Electrochemical Society Fabrication of GaAs-on-Insulator via Low Temperature Wafer Bonding and Sacrificial Etching of Ge by XeF2, Journal of The Electrochemical Society, 159 (2) H183-H190 (2012) H183 (Year: 2012).*

(Continued)

*Primary Examiner* — Latanya N Crawford Eason
(74) *Attorney, Agent, or Firm* — Holzer Patel Drennan

(57) ABSTRACT

Provided are a method for transferring a compound semiconductor single crystal thin film layer and a method for preparing a single crystal GaAs—OI composite wafer, including: preparing a graphite transition layer on a first substrate; growing the compound semiconductor single crystal thin film layer on the graphite transition layer; preparing a first dielectric layer on the compound semiconductor single crystal thin film layer; preparing a second dielectric layer on a second substrate; combining the first substrate and the second substrate by bonding the first dielectric layer and the second dielectric layer; applying a lateral external pressure, such that the compound semiconductor single crystal thin film layer and the first substrate are transversely split at the graphite transition layer, and the compound semiconductor single crystal thin film layer is transferred to the second substrate.

8 Claims, 2 Drawing Sheets

(56) References Cited

FOREIGN PATENT DOCUMENTS

| CN | 103021946 A | 4/2013 |
|---|---|---|
| CN | 106611740 A | 5/2017 |
| CN | 110050335 A | 7/2019 |

OTHER PUBLICATIONS

Kasper, Fusion bonding of silicon nitride surfaces, 2011 J. Micromech. Microeng. 21 125015(5pp) (Year: 2011).*

Office Action dated Jun. 27, 2020 for Chinese Patent Application 201910703731.5.

Search Report dated Jun. 17, 2020 for Chinese Patent Application 201910703731.5.

* cited by examiner

METHOD FOR TRANSFERRING COMPOUND SEMICONDUCTOR SINGLE CRYSTAL THIN FILM LAYER AND METHOD FOR PREPARING SINGLE CRYSTAL GAAS-OI COMPOSITE WAFER

TECHNICAL FIELD

The present disclosure relates to the technical field of semiconductor device integration, in particular to a method for transferring a compound semiconductor single crystal thin film layer and a method for preparing a single crystal GaAs—OI composite wafer.

BACKGROUND ART

Since the 1970s, the microelectronics industry has developed in accordance with Moore's Law for nearly half a century. Currently, the characteristic size of the device is close to 10 nm. CMOS technology based on silicon materials has been severely challenged by items such as the basic physical characteristics of materials, manufacturing costs and even economic operation rules in many aspects such as speed, power consumption, integration, and manufacturing cost. The international academia and industry generally believe that three major development trends of the micro-nano electronics industry in the "post-Moore era" are: continuation of Moore's law, that is, the size of semiconductor device continues to reduce; expansion of Moore's law, that is, to pursue functional diversification of system integration; superior to COMS. This has brought considerable challenges to Si-based materials. Due to the secondary effect caused by the short channel of MOS transistors, for traditional planar devices, the method of improving performance by continuously reducing the size of the device encounters more and more difficulties, which seriously restricts the further improvement of integration.

In order to increase the on-state current of MOS transistors, channel materials with high mobility, such as germanium (Ge) and group III-V semiconductors, are required, group III-V compound semiconductor materials also have the ability to form high-quality MOS interfaces, so that the performance of such MOS devices is significantly superior than that of silicon-based MOS devices having the same size. Especially, in the case where a 7 nm technology node is reached, for FinFET technology, the gate may lose the ability to control the channel, and Group III-V materials may be used for the channel. On the other hand, it is desired that the chip integrates more functions. With the continuous increase of the operating speed of microprocessor, the electrical interconnection technology in integrated circuits encounters a bottleneck and faces problems in terms of bandwidth, delay, power consumption, and the like. In order to make full use of the advantages of optical communication, it is required to realize high-speed optical interconnection between multiple cores of the microprocessor. Therefore, SOI is regarded as an efficient integrated material, and in many fields, it is considered that SOI devices with unique structures can effectively suppress the deficiencies of bulk silicon devices, give full play to the potential of silicon integration technology, and is a great advantageous means for ensuring the rapid development of the integrated circuit industry in accordance with Moore's Law.

The traditional bulk silicon integrated circuit using silicon material as substrate is restricted in application and development due to its parasitic thyristor latch-up effect, soft failure under ray irradiation environment, parasitic capacitance, hot carrier effect and other limitations. SOI technology has the advantages of high performance ULSI, high temperature and high pressure resistance, anti-irradiation, low voltage, low power consumption and high integration, etc, and has extremely broad development prospects and is internationally recognized as the silicon integrated circuit technology in the 21st century. In recent years, SOI technology has developed into one of the mainstream technologies for manufacturing ULSL integrated circuit. The combination of SOI material and GaAs material and the development of integration technology have opened a window for realizing the multifunctionalization of GaAs semiconductor photodetectors. Integrating GaAs material onto SOI substrates provides the possibility for large-scale heterogeneous integration.

At present, the method generally used is epitaxial growth of single crystal GaAs on Si substrate. The disadvantage of this method is that the lattice structure of Si substrate is different from the lattice structure of single crystal GaAs, and lattice mismatch may be caused due to dislocation or other reasons during the epitaxial growth process, such that the quality of the epitaxially grown GaAs crystal is not high and cannot meet the requirements for the subsequent manufacture of high-quality device.

SUMMARY

In view of the deficiencies in the above problems, the present disclosure provides a method for transferring a compound semiconductor single crystal thin film layer and a method for preparing a single crystal GaAs—OI composite wafer.

The present disclosure provides a method for transferring a compound semiconductor single crystal thin film layer, including:

preparing a graphite transition layer on a first substrate;

growing the compound semiconductor single crystal thin film layer on the graphite transition layer, wherein the compound semiconductor single crystal thin film layer has the same lattice structure as the first substrate;

preparing a first dielectric layer on the compound semiconductor single crystal thin film layer;

preparing a second dielectric layer on a second substrate;

combining the first substrate and the second substrate by bonding the first dielectric layer and the second dielectric layer;

applying a lateral external pressure, such that the compound semiconductor single crystal thin film layer and the first substrate are transversely split at the graphite transition layer, and the compound semiconductor single crystal thin film layer is transferred to the second substrate.

As a further improvement of the present disclosure, the first substrate is a single crystal GaAs substrate or a single crystal Ge substrate.

As a further improvement of the present disclosure, the compound semiconductor single crystal thin film layer is a GaAs single crystal thin film layer.

As a further improvement of the present disclosure, the second substrate is a Si substrate.

As a further improvement of the present disclosure, the first dielectric layer or the second dielectric layer is a $Si_3N_4$ layer, a $SiO_2$ layer, an $Al_2O_3$ layer or an AlN layer, and the second dielectric layer serves as a buried insulating layer of the second substrate.

As a further improvement of the present disclosure, each of the first dielectric layer and the second dielectric layer is the $Si_3N_4$ layer.

The present disclosure also provides a method for preparing a single crystal GaAs—OI composite wafer based on the above transfer method, including:

preparing an A wafer, including:

preparing a graphite transition layer on a single crystal GaAs substrate or a single crystal Ge substrate;

epitaxially growing a GaAs single crystal thin film layer on the graphite transition layer; and preparing a $Si_3N_4$ dielectric layer on the GaAs single crystal thin film layer;

preparing a B wafer, including:

preparing a $Si_3N_4$ dielectric layer on a surface of a Si substrate as a buried insulating layer; and preparing the single crystal GaAs—OI composite wafer, including:

bonding the $Si_3N_4$ layer on a top layer of the A wafer and the $Si_3N_4$ layer on a top layer of the B wafer, such that the A wafer and the B wafer are closely combined;

applying a lateral external pressure onto the A wafer, such that the composite wafer is split transversely at the graphite transition layer, removing the single crystal GaAs substrate or the single crystal Ge substrate, and removing the graphite transition layer, thus the single crystal GaAs—OI composite wafer, which has a structure of a Si substrate, a $Si_3N_4$ dielectric layer and a GaAs single crystal thin film layer arranged in sequence, is obtained.

As a further improvement of the present disclosure, in the A wafer:

a thickness of the graphite transition layer is 50-100 nm, a thickness of the GaAs single crystal thin film layer is 10-2000 nm, and a thickness of the $Si_3N_4$ layer is 100-400 nm.

As a further improvement of the present disclosure, in the B wafer:

a $SiO_2$ layer is further provided between the Si substrate and the $Si_3N_4$ dielectric layer;

a thickness of the $Si_3N_4$ layer is 100-400 nm.

As a further improvement of the present disclosure, after the single crystal GaAs substrate or the single crystal Ge substrate and the graphite transition layer are split transversely and removed under the external pressure, the graphite transition layer remained on the GaAs single crystal thin film layer is ground away by chemical etching and mechanical grinding and polishing methods to obtain a high-quality GaAs single crystal thin film layer surface.

Compared with the prior art, the beneficial effects of the present disclosure are as follows:

The method for transferring a compound semiconductor single crystal thin film layer and the method for preparing a GaAs—OI composite wafer provided by the present disclosure can transfer an epitaxially grown high-quality compound semiconductor single crystal thin film layers to a Si-based substrate by means of dielectric layer bonding, and can realize the preparation of a high-quality, large-area, low-cost compound semiconductor single crystal thin film layer on a SOI substrate, thereby promoting the industrial applications of semiconductor device on GaAs—OI.

10: A wafer; 11: single crystal GaAs substrate; 12: graphite transition layer; 13: GaAs single crystal thin film layer; 14: $Si_3N_4$ dielectric layer;

20: B wafer; 21: Si substrate; 22: SiO2 layer; 23: Si3N4 layer;

30: single crystal GaAs—OI composite wafer; 31: Si substrate; 32: $SiO_2$ layer; 33: $Si_3N_4$ layer; 34: GaAs single crystal thin film layer.

DETAILED DESCRIPTION

In order to make the objectives, technical solutions, and advantages of the embodiments of the present disclosure clearer, the technical solutions in the embodiments of the present disclosure will be described clearly and completely in combination with the drawings in the embodiments of the present disclosure. Obviously, the described embodiments are part of the embodiments of the present disclosure, but not all embodiments. Based on the embodiments of the present disclosure, all other embodiments obtained by a person of ordinary skill in the art without creative work shall fall within the protection scope of the present disclosure.

In the description of the present disclosure, it should be noted that the orientation or positional relationship indicated by the terms "center", "on", "below", "left", "right", "vertical", "horizontal", "inner", "outer", etc. is the orientation or positional relationship shown based on the drawings, and is only for the convenience of describing the present disclosure and simplifying the description, rather than indicating or implying that the referred device or element must have a specific orientation or be constructed and operated in a specific orientation, therefore they cannot be understood as a limitation to the present disclosure. In addition, the terms "first", "second", and "third" are for descriptive purposes only, and cannot be understood as indicating or implying relative importance.

In the description of the present disclosure, it should also be noted that, unless otherwise clearly specified and defined, the terms "mounting", "connecting", "connected" should be understood in a broad sense. For example, it can be a fixed connection, a detachable connection or an integral connection; it can be a mechanical connection or an electrical connection; it can be directly connected, or indirectly connected through an intermediate medium, or it can be an internal communication between two components. For those of ordinary skill in the art, the specific meaning of the above terms in the present disclosure can be understood according to specific situations.

The present disclosure will be further described in detail below with reference to the drawings.

Figure 1:
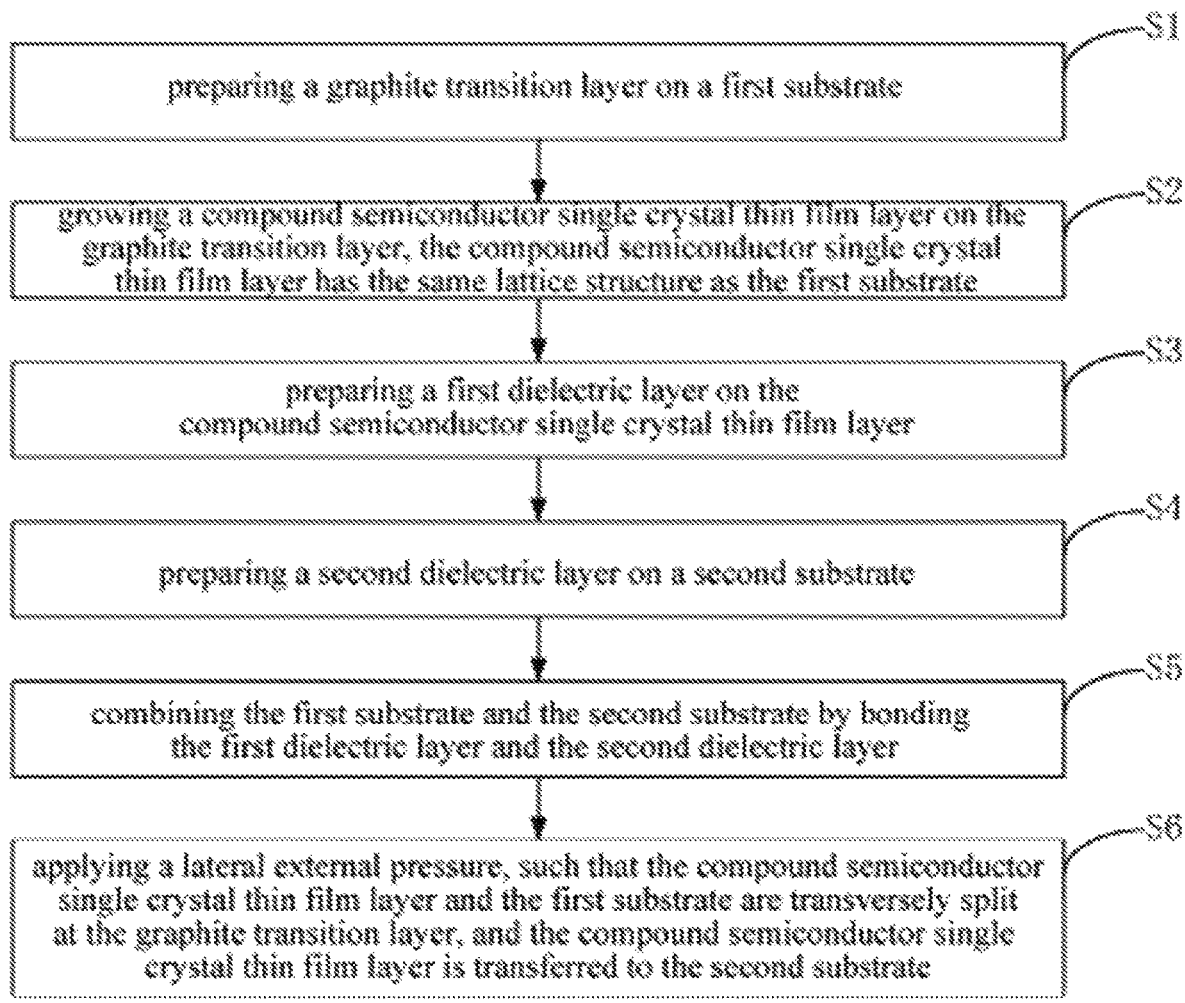
FIG. 1 is a flowchart of a method for transferring a compound semiconductor single crystal thin film layer disclosed in an embodiment of the present disclosure.

As shown in FIG. 1, the present disclosure provides a method for transferring a compound semiconductor single crystal thin film layer, including:

S1: preparing a graphite transition layer on a first substrate; wherein, a layer of graphite transition layer is deposited on the first substrate by magnetron sputtering; the first substrate is preferably a single crystal GaAs substrate or a single crystal Ge substrate;

S2: epitaxially growing the compound semiconductor single crystal thin film layer on the graphite transition layer, wherein the compound semiconductor single crystal thin film layer has the same lattice structure as the first substrate; wherein, when the first substrate is the single crystal GaAs substrate or the single crystal Ge substrate, the compound semiconductor single crystal thin film layer is a GaAs single crystal thin film layer; meanwhile, other compound semiconductor single crystal thin film layers and corresponding substrates may also be selected according to actual needs;

S3: preparing a first dielectric layer on the compound semiconductor single crystal thin film layer; wherein, the first dielectric layer is a $Si_3N_4$ layer, a $SiO_2$ layer, an $Al_2O_3$ layer or an AlN layer, preferably a $Si_3N_4$ layer;

S4: preparing a second dielectric layer on a second substrate; wherein, the second substrate is a Si substrate, and the second dielectric layer is a $Si_3N_4$ layer, a $SiO_2$ layer, an $Al_2O_3$ layer or an AlN layer, preferably a $Si_3N_4$ layer;

S5: combining the first substrate and the second substrate by bonding the first dielectric layer and the second dielectric layer;

S6: applying a lateral external pressure, such that the compound semiconductor single crystal thin film layer and the first substrate are transversely split at the graphite transition layer, and the compound semiconductor single crystal thin film layer is transferred to the second substrate.

The present disclosure provides a method for preparing a single crystal GaAs—OI composite wafer based on the above transfer method, including: preparing an A wafer 10 with a GaAs single crystal thin film layer, preparing a B wafer 20 having a SOI substrate with a $Si_3N_4$ layer as a buried insulating layer thereof, and preparing the single crystal GaAs—OI composite wafer, i.e., C wafer.

Figure 2:
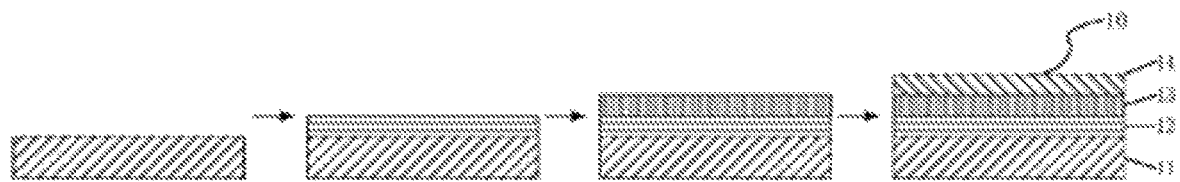
FIG. 2 is a flowchart illustrating structure and preparation of an A wafer disclosed in an embodiment of the present disclosure.

As shown in FIG. 2, the A wafer 10 of the present disclosure comprises a single crystal GaAs substrate 11, a graphite transition layer 12, a GaAs single crystal thin film layer 13 and a $Si_3N_4$ dielectric layer 14, the method for preparing the A wafer is as follows.

A layer of graphite transition layer 12 is deposited on the single crystal GaAs substrate 11 or the single crystal Ge substrate by using a magnetron sputtering method, and a specific preparation method thereof is as follows:

The graphite transition layer is prepared on a single crystal GaAs substrate or a Ge substrate by using a magnetron sputtering method. First, the graphite sheet is subjected to processes such as cutting, grinding, polishing, etc., then the powder on a surface of the graphite sheet is purged with nitrogen, and then the graphite sheet is placed in a vacuum environment at high temperature of about 1000° C. for 60 minutes, so that various impurities contained in the graphite sheet can be volatilized, thus the impurities on the surface and inside of the graphite sheet are further removed. After the above treatment, the purity of the graphite can reach to 99.99%, and a graphite transition layer 12 with a thickness of 50-100 nm is DC sputtered at a rate of 1.2 nm/min using the above high-purity graphite target material.

The GaAs single crystal thin film layer 13 is epitaxially grown on the graphite transition layer 12; furthermore, the thickness of the GaAs single crystal thin film layer is 10-2000 nm, preferably 100-500 nm.

The $Si_3N_4$ dielectric layer 14 is prepared on the GaAs single crystal thin film layer 13, and a specific preparation method thereof is as follows:

Using several gases among $N_2$, $SiH_4$, $NH_3$, $HCl_4$, and $H_2Cl_2$ as reaction gases, the $Si_3N_4$ dielectric layer is prepared by a PECVD method in the temperature range of 300-500° C.

Figure 3:
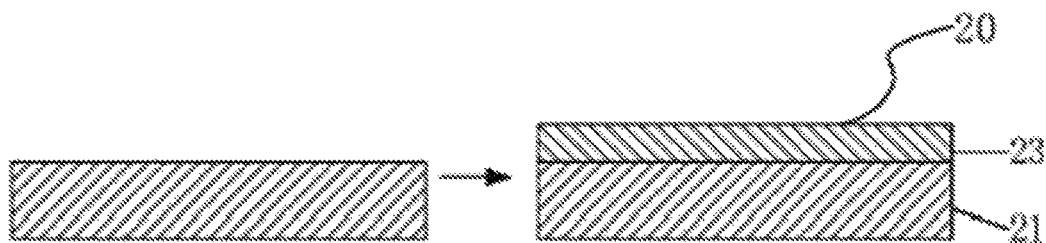
FIG. 3 is a flowchart illustrating structure and preparation of a first B wafer disclosed in an embodiment of the present disclosure.

As shown in FIG. 3, the B wafer 20 of the present disclosure comprises a Si substrate 21 and a $Si_3N_4$ layer 23, and the method for preparing the B wafer 20 is as follows.

The $Si_3N_4$ dielectric layer 23 is prepared on a surface of the Si substrate 21 as a buried insulating layer, and a specific preparation method thereof is as follows.

Using several gases among $N_2$, $SiH_4$, $NH_3$, $HCl_4$, and $H_2Cl_2$ as reaction gases, the $Si_3N_4$ dielectric layer is prepared by a PECVD method in the temperature range of 300-500° C.

Figure 4:
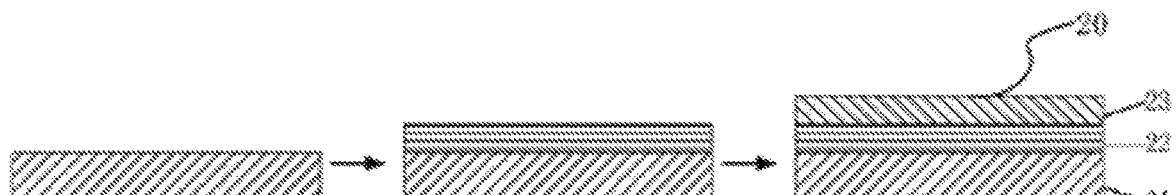
FIG. 4 is a flowchart illustrating structure and preparation of a second B wafer disclosed in an embodiment of the present disclosure.

As shown in FIG. 4, the B wafer 20 of the present disclosure comprises a Si substrate 21, a $SiO_2$ layer 22 and a $Si_3N_4$ layer 23, the method for preparing the B wafer is as follows.

The $SiO_2$ layer 22 is prepared on a surface of the Si substrate 21, and the $Si_3N_4$ dielectric layer 23 is prepared on a surface of the $SiO_2$ layer 22; furthermore, the thickness of the $Si_3N_4$ layer is 100-400 nm.

Figure 5:
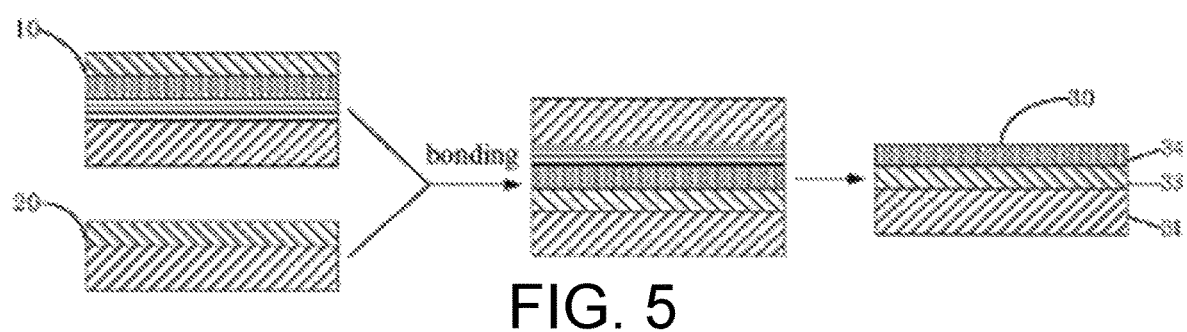
FIG. 5 is a flowchart illustrating structure and preparation of a first single crystal GaAs—OI composite wafer disclosed in an embodiment of the present disclosure.

As shown in FIG. 5, the single crystal GaAs—OI composite wafer 30 of the present disclosure comprises a Si substrate 31, a $Si_3N_4$ dielectric layer 33, and a GaAs single crystal thin film layer 34, and the method for preparing the single crystal GaAs—OI composite wafer includes:

Bonding the $Si_3N_4$ layer on a top layer of the A wafer 10 and the $Si_3N_4$ layer on a top layer of the B wafer 20 illustrated in FIG. 3 by means of interatomic force bonding, such that the A wafer and the B wafer are closely combined;

Applying a lateral external pressure onto the A wafer, such that the composite wafer is split transversely at the graphite transition layer, removing the single crystal GaAs substrate or the single crystal Ge substrate, and removing the graphite transition layer, thus the single crystal GaAs—OI composite wafer, which has a structure of a Si substrate, a $Si_3N_4$ dielectric layer and a GaAs single crystal thin film layer arranged in sequence, is obtained;

Grinding away the graphite transition layer remained on the GaAs single crystal thin film layer by chemical etching and mechanical grinding and polishing methods to obtain a high-quality GaAs single crystal thin film layer surface.

Figure 6:
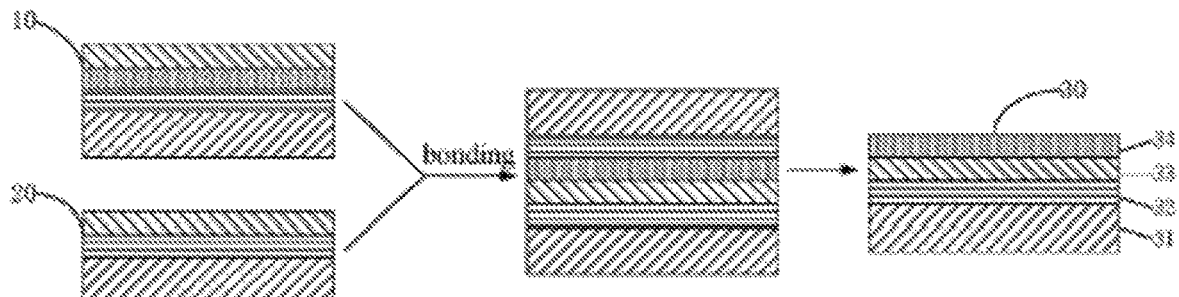
FIG. 6 is a flowchart illustrating structure and preparation of a second single crystal GaAs—OI composite wafer disclosed in an embodiment of the present disclosure.

As illustrated in FIG. 6, the single crystal GaAs—OI composite wafer 30 of the present disclosure comprises a Si substrate 31, a $SiO_2$ layer 32, a $Si_3N_4$ dielectric layer 33, and a GaAs single crystal thin film layer 34, the method for preparing the single crystal GaAs—OI composite wafer includes:

Bonding the $Si_3N_4$ layer on a top layer of the A wafer 10 and the $Si_3N_4$ layer on a top layer of the B wafer 20 illustrated in FIG. 4 by means of interatomic force bonding, such that the A wafer and the B wafer are closely combined;

Applying a lateral external pressure onto the A wafer, such that the composite wafer is split transversely at the graphite transition layer, removing the single crystal GaAs substrate or the single crystal Ge substrate, and removing the graphite transition layer, thus the single crystal GaAs—OI composite wafer, which has a structure of a Si substrate, a $Si_3N_4$ dielectric layer and a GaAs single crystal thin film layer arranged in sequence, is obtained;

Grinding away the graphite transition layer remained on the GaAs single crystal thin film layer by chemical etching and mechanical grinding and polishing methods to obtain a high-quality GaAs single crystal thin film layer surface.

The present disclosure has the following advantages.

The method for transferring a GaAs single crystal thin film layer and the method for preparing a GaAs—OI composite wafer provided by the present disclosure, can transfer the grown high-quality GaAs single crystal thin film layer to the Si-based substrate by means of dielectric layer bonding, and can realize the preparation of a high-quality, large-area, low-cost GaAs single crystal thin film layer on a SOI substrate, thereby promoting the industrial applications of semiconductor device on GaAs—OI. The epitaxial structure provided by the present disclosure takes into account the actual requirements of both epitaxial growth and device performance, and the thickness of each layer and the manufacturing process can be adjusted within a certain range according to specific materials and device parameters; and on the premise that epitaxial growth can be realized, the transfer of GaAs single crystal thin film layer and the preparation of the composite wafer are realized.

The single crystal GaAs thin film of the present disclosure is epitaxially grown on the single crystal GaAs substrate or the single crystal Ge substrate, the single crystal Ge and the single crystal GaAs have the same lattice structure, the graphite is a multilayer reticular superimposed body formed by connecting and superimposing hexagonal carbon rings to each other, and the molecular layers are interconnected by Van der Waals force. During the epitaxy process, a sliding motion may occur between graphite monolayers, and the compressive stress inside the thin film is released, thus the lattice mismatch can be eliminated.

In the present disclosure, the $Si_3N_4$ dielectric layer is used as both the buried insulating layer on the Si substrate and the dielectric layer on the single crystal GaAs thin film. This is not only because $Si_3N_4$ can replace $SiO_2$ as the buried insulating layer due to the property of $Si_3N_4$, but also because the Si—Si bond of the $Si_3N_4$ dielectric and the single crystal Si can be bonded at the heterogeneous surface in manner of interatomic force, and the As—N bond of the $Si_3N_4$ dielectric and the GaAs single crystal thin film layer can be bonded at the heterogeneous surface in manner of interatomic force. Such a bonding manner of the Si—Si bond and As—N bond enables the prepared composite wafer to withstand high temperature in the subsequent epitaxial process. However, in other existing technical means, there is no interatomic bonding force of the Si—Si bond and the As—N bond, as a result, fracture occurs during the subsequent epitaxial growth process since it is difficult to withstand the high temperature of thousands of degrees Celsius.

The above are only preferred embodiments of the present disclosure and are not intended to limit the present disclosure. For those skilled in the art, the present disclosure may have various modifications and changes. Any modification, equivalent replacement, improvement, etc. made within the spirit and principle of the present disclosure shall be included in the protection scope of the present disclosure.

What is claimed is:

1. A method for transferring a compound semiconductor single crystal thin film layer, comprising:
   preparing a graphite transition layer on a first substrate;
   growing the compound semiconductor single crystal thin film layer on the graphite transition layer, wherein the compound semiconductor single crystal thin film layer has the same lattice structure as the first substrate;
   preparing a first dielectric layer on the compound semiconductor single crystal thin film layer;
   preparing a second dielectric layer on a second substrate;
   combining the first substrate and the second substrate by bonding the first dielectric layer and the second dielectric layer; and
   applying a lateral external pressure, such that the compound semiconductor single crystal thin film layer and the first substrate are transversely split at the graphite transition layer, and the compound semiconductor single crystal thin film layer is transferred to the second substrate, wherein each of the first dielectric layer and the second dielectric layer is an $Si_3N_4$ layer, and the second dielectric layer serves as a buried insulating layer of the second substrate, wherein an $SiO_2$ layer is further provided between the second substrate and the $Si_3N_4$ dielectric layer.

2. The method for transferring a compound semiconductor single crystal thin film layer of claim 1, wherein the first substrate is a single crystal GaAs substrate or a single crystal Ge substrate.

3. The method for transferring a compound semiconductor single crystal thin film layer of claim 2, wherein the compound semiconductor single crystal thin film layer is a GaAs single crystal thin film layer.

4. The method for transferring a compound semiconductor single crystal thin film layer of claim 1, wherein the second substrate is an Si substrate.

5. A method for preparing a single crystal GaAs—OI composite wafer, comprising: preparing an A wafer, comprising: preparing a graphite transition layer on a single crystal GaAs substrate or a single crystal Ge substrate; epitaxially growing a GaAs single crystal thin film layer on the graphite transition layer; and preparing a $Si_3N_4$ dielectric layer on the GaAs single crystal thin film layer; preparing a B wafer, comprising: preparing a $SiO_2$ layer on a surface of a Si substrate; and preparing a $Si_3N_4$ dielectric layer on a surface of the $SiO_2$ layer as a buried insulating layer; and preparing the single crystal GaAs—OI composite wafer, comprising: bonding the $Si_3N_4$ layer on a top layer of the A wafer and the $Si_3N_4$ layer on a top layer of the B wafer, such that the A wafer and the B wafer are closely combined; and applying a lateral external pressure onto the A wafer, such that the composite wafer is split transversely at the graphite transition layer, removing the single crystal GaAs substrate or the single crystal Ge substrate, and removing the graphite transition layer, thus the single crystal GaAs—OI composite wafer, which has a structure of a Si substrate, a $SiO_2$ layer, a $Si_3N_4$ dielectric layer and a GaAs single crystal thin film layer arranged in sequence, is obtained.

6. The method for preparing a single crystal GaAs—OI composite wafer of claim 5, wherein, in the A wafer:
   a thickness of the graphite transition layer is 50-100 nm, a thickness of the GaAs single crystal thin film layer is 10-2000 nm, and a thickness of the $Si_3N_4$ layer is 100-400 nm.

7. The method for preparing a single crystal GaAs—OI composite wafer of claim 5, wherein, in the B wafer:
   a thickness of the $Si_3N_4$ layer is 100-400 nm.

8. The method for preparing a single crystal GaAs—OI composite wafer of claim 5, wherein, after the single crystal GaAs substrate or the single crystal Ge substrate and the graphite transition layer are split transversely and removed under the external pressure, the graphite transition layer remaining on the GaAs single crystal thin film layer is ground away by chemical etching and mechanical grinding and polishing methods to obtain a high-quality GaAs single crystal thin film layer surface.

* * * * *